US006218085B1

(12) United States Patent
Molloy et al.

(10) Patent No.: US 6,218,085 B1
(45) Date of Patent: Apr. 17, 2001

(54) PROCESS FOR PHOTORESIST REWORK TO AVOID SODIUM INCORPORATION

(75) Inventors: Simon J. Molloy; Nace Layadi; Allen Yen, all of Orlando; Brian D. Crevasse, Apopka; Steven A. Lytle, Orlando, all of FL (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/400,406

(22) Filed: Sep. 21, 1999

(51) Int. Cl.[7] .......... G03F 7/36

(52) U.S. Cl. .......... 430/329; 430/260; 438/711

(58) Field of Search .......... 430/260, 329; 438/711

(56) References Cited

U.S. PATENT DOCUMENTS 4,414,606 11/1983 Cynkar et al. .......... 427/90
4,778,739 10/1988 Protschka .......... 430/30
5,849,639 12/1998 Molloy et al. .......... 438/714
6,033,990 * 3/2000 Kishimoto et al. .......... 438/710
6,114,259 * 9/2000 Sukharev et al. .......... 438/789

* cited by examiner

*Primary Examiner*—Hoa Van Le
(74) *Attorney, Agent, or Firm*—Fay, Sharpe, Fagan, Minnich & McKee, LLP

(57) ABSTRACT

A method for stripping photoresist material (26) from a semiconductor substrate (16) avoids incorporation of sodium and other contaminant ions from a rework solvent. An oxygen and hydrogen plasma mixture strips the photoresist material without significant introduction of oxygen into the titanium nitride layer (24). Any oxidation of the titanium nitride is reversed by exposing the substrate to an oxygen-free, reducing plasma, such as a hydrogen-containing plasma. The titanium nitride layer is thereby much less susceptible to incorporation of contaminant ions in a subsequent cleaning with rework solvent than a layer which has been extensively oxidized during the plasma stripping process.

20 Claims, 1 Drawing Sheet

PROCESS FOR PHOTORESIST REWORK TO AVOID SODIUM INCORPORATION

FIELD OF THE INVENTION

The present invention relates to the semiconductor arts. It finds particular application in the control of sodium incorporation during photoresist rework of semiconductor devices, and will be described with particular reference thereto. It should be appreciated, however, that the invention is also applicable to control of sodium incorporation in other applications.

BACKGROUND OF THE INVENTION

Semiconductor integrated circuits typically comprise layers of stacked interconnected metal layers with dielectric materials between them to form a device, such as a transistor. Typically, a plurality of such layers are laid down on a substrate of silicon, or the like. The layers forming the device, including gates, etc., are then covered with a barrier layer, a metal layer, and finally a layer of titanium nitride, which serves as an anti-reflective coating. A pattern of photoresist material is deposited on the titanium nitride layer for providing electrical contacts with the transistor, or other device. Lithographic techniques are used to pattern the photoresist using a photo-sensitive mask.

In the event that the photoresist pattern is unsatisfactory, for example, improperly shaped, the photoresist may be reworked, i.e., removed and a fresh photoresist layer deposited.

Current photoresist rework processes use a solvent/and or an oxygen-containing plasma to remove the photoresist before starting the lithographic sequence again. Typically, the wafer on which the photoresist is deposited is subjected to an oxygen plasma at a temperature of about 250 °C. to strip the photoresist. After, the stripping process, the surface is cleaned with a rework solvent to remove photoresist residues. Commonly used solvents include $H_2SO_4/H_2O_2$ or solutions commonly known in the trade as EKC-265 (a solution comprising hydroxyl amine, 2-(2-aminoethoxy) ethanol, cathecol, and an alkaline buffer), and ACT-CMI (a solution of dimethylacetamide and diethanolamine).

The high temperatures and oxygen gas used to strip the photoresist tends to cause oxidation of the titanium nitride layer. The TiN reacts with oxygen radicals to form an oxynitride of the general formula $TiO_XN_Y$. The oxidation changes the conductivity of the TiN layer and it becomes more susceptible to contamination by mobile ions during the solvent cleaning step. Mobile ions, such as $Na^+$, $K^+$ $Cl^-$, fluoride species, or other ionic inorganic compounds, tend to become incorporated into the solvent over time. If they become absorbed by the titanium nitride layer, the contaminants may travel through the various layers and cause electrical device defects and degradation in the overall performance and yield of the device.

The present invention provides a new and improved method of photoresist rework, which overcomes the above referenced problems, and others.

SUMMARY OF THE INVENTION

In accordance with one aspect of the present invention, a method for removing a photoresist layer from a substrate is provided. The method includes providing a substrate having an oxidizable layer and a photoresist layer. The layers are located directly or indirectly on a surface of the substrate. The method further includes exposing the substrate to a plasma containing hydrogen and oxygen in an amount effective to substantially strip the photoresist layer.

In accordance with another aspect of the present invention, a method for removing a photoresist layer from a substrate is provided. The method includes providing a substrate having an oxidizable anti-reflective coating and a photoresist layer. The layer and coating are located directly or indirectly on a surface of the substrate. The method further includes exposing the substrate to a plasma containing hydrogen and oxygen in an amount effective to substantially strip the photoresist layer. Further, the method includes exposing the substrate to a plasma formed from a reducing gas that reverses any oxidation of the oxidizable layer which has occurred in the plasma containing hydrogen and oxygen.

One advantage of the present invention is that it reduces contamination of a semiconductor device by mobile ions during photoresist rework.

Another advantage of the present invention is that it enables a relatively rapid photoresist strip without unduly oxidizing the titanium nitride layer.

Another advantage of the present invention is that it prevents degradation of device electrical performance.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

The FIGURE is a schematic sectional view of a wafer with a transistor device formed thereon.

DETAILED DESCRIPTION OF THE PREFERRED EMBODIMENTS

Figure 1:
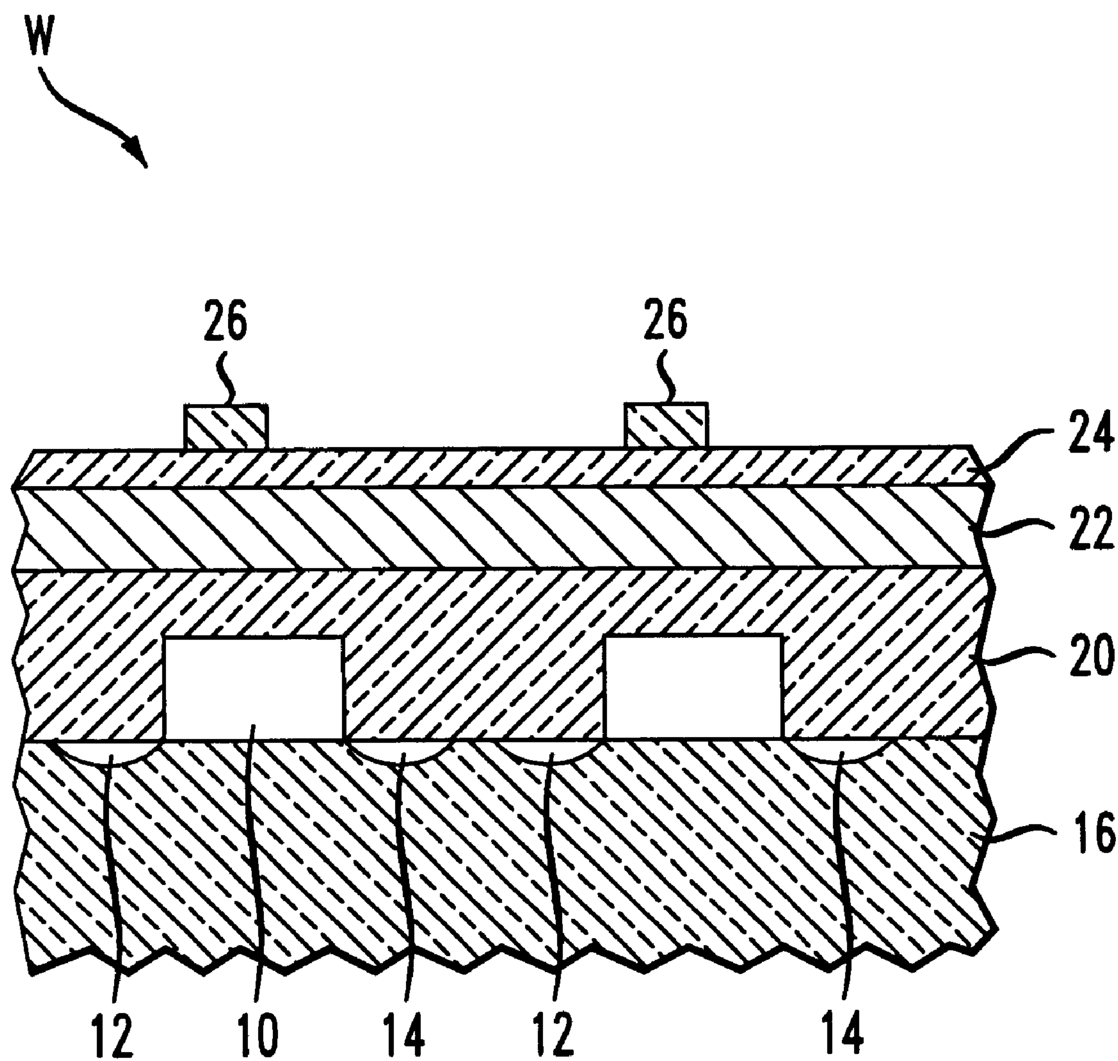

With reference to the FIGURE, a wafer W includes a number of semiconductor devices, such as transistors formed thereon. Each device comprises a gate 10, and source 12 and drain regions 14. The transistor is formed, for example, on a semiconductor substrate 16. Suitable substrates are silicon wafers, prepared, for example, by the Czochralski technique. The major surface of the wafer is not critical and any suitable orientation, such as a (100), (110), or (111), is useful. Other substrate materials, such as gallium arsenide, may also be employed.

Barrier 20 and metal 22 layers are formed over the devices. The metal, such as aluminum, provides the necessary connections while the barrier serves as an intermediate dielectric to isolate the metal interconnect level from the polysilicon. A layer 24 of titanium nitride is formed on the metal layer. Finally, a photoresist pattern 26 is deposited on the titanium nitride layer to provide the electrical connections between the wafer and an external source of power. The patterning of the various layers for selective formation of the wafer are achieved using photolithographic and etching techniques. The choice of dielectric materials, photoresist material, and substrate material is not critical to the invention. The steps for fabricating an actual transistor involves many more steps. These steps are well known and are described in S. M. Sze, "VLSI Technology," 2nd. ed., New York: McGraw-Hill (1988).

After patterning of the photoresist layer, the photoresist layer is evaluated to determine if various characteristics, such as profile or dimensions, are met, for example, by sampling wafers periodically and sectioning through the photoresist layer. Or, the wafer may be examined by a variety of non-destructive methods, such as visual examination or examination using a variety of microscope techniques, for example, top down scanning electron microscopy (SEM). If it is determined that the photoresist pattern does not meet preselected standards, such as profile, width, or height, the wafer or wafers which are determined to be sub-standard are reworked by stripping the photoresist pattern from the surface and then reapplying a fresh photoresist pattern.

The stripping process is carried out in a suitable reactor or vacuum chamber for application of a gas plasma. One suitable reactor is a Gasonics Aura 3010 reactor. Other reactors may also be used, such as downstream or plasma reactors, other microwave plasma reactors, remote plasma source (RPS) reactors, high density (inductively coupled) reactors, triode or other dual powered types of reactors, upper power plasma reactors, and low power RIE plasma reactors. The reactor is preferably operated in a mode giving a low wafer bias, which implies a maximum energy of less than about 50 electron volts (eV) for ions striking the wafer surface, i.e., the ion bombardment in the gas plasma process should be as gentle as possible. To avoid plasma damage, it has been found that a microwave reactor with an applied power of 1000 to 1500 watts works well.

A plasma is produced with a low substrate bias voltage to bombard the wafer with a gas mixture containing atomic hydrogen. In a preferred method, the stripping process is carried out in two steps. The first step is carried out in a plasma which includes both atomic hydrogen and atomic oxygen. The second step is carried out in a plasma which includes atomic hydrogen, but which is free, or substantially free of oxygen.

The presence of oxygen in the first step enhances the stripping rate of hydrogen alone, allowing a fairly fast stripping rate of around 1–1.5 micrometers of photoresist per minute ($\mu$/min), or more. Since the photoresist layer 26 is typically of the order of about 1$\mu$ in height, or less, stripping is readily achieved in under a minute. The proportion of oxygen in the mixture is selected to provide a good strip rate without oxidation of a large portion of the titanium nitride film 24.

While some minimal surface oxidation of the titanium nitride may occur in the first step, this oxidation is reversed in the second step, where the oxygen-free plasma reduces any oxidized titanium nitride to pure titanium nitride. Thus, while the second step may have a lower photoresist removal rate, the use of a two step process allows for a relatively fast strip time and limited resultant oxidation of the titanium nitride layer 24.

If the oxygen content of the gas mixture in the first step is too high, the interior of the titanium nitride film, as well as the surface, is oxidized and it is very difficult to reverse the oxidation completely in the second step. The second step may be eliminated, if desired, although it is preferable to use both steps.

After the stripping process is complete, the titanium nitride surface may be washed with a suitable solvent, such as ACT-CMI, or others previously described, without undue incorporation of contaminating mobile ions, such as sodium or potassium ions. The amount of mobile ions incorporated is much less than with conventional oxygen plasma techniques.

In the first step, the gas mixture includes a carrier gas, preferably an inert gas, such as helium or nitrogen; oxygen; and a source of atomic hydrogen, such as hydrogen gas, $NH_3$, $CH_4$, $H_2O$, or combinations thereof. The gases may be introduced to the chamber separately, or mixed together prior to introduction.

Where hydrogen is used in forming the plasma, the plasma is preferably formed from a gas mixture containing a minor amount of hydrogen, preferably 2–10 wt % of hydrogen and more preferably, less than about 4% hydrogen. While larger amounts of hydrogen can be used in forming a plasma, the use of larger quantities of hydrogen raises safety concerns, such as the risk of explosion.

Preferably, the oxygen content of the gas mixture in the first step is from about 5–20%, more preferably, less than 15%, and most preferably, about 10% oxygen. A 10% oxygen content provides a good stripping rate without significant oxidation of the titanium nitride layer. Auger elemental spectroscopy shows that at higher percentages of oxygen, around 20–25%, or above, the titanium nitride oxidation occurring in the first step is difficult to reverse in the second step.

This is in contrast to typical oxygen-based plasmas that contain as much as 90–100% oxygen.

The preferred oxygen content is also dependent on the amount of hydrogen in the gas mixture. The above oxygen concentrations were determined for mixtures containing about 3–4% hydrogen, typically 3.6% hydrogen. Where the hydrogen concentration is higher, higher concentrations of oxygen may be accommodated without a significant increase in the oxidation of the titanium nitride layer. However, at higher hydrogen concentrations, the strip rate is increased, and thus good strip rates may be maintained even with relatively low levels of oxygen. If the hydrogen concentration is very low, around 2% or less, an oxygen concentration of below about 10% is preferred to avoid significant oxidation of the titanium nitride 24 surface.

Accordingly, the ratio of oxygen to hydrogen in the gas mixture for the first step is preferably from about 1:1 to about 4:1, in terms of weight percent, more preferably, from 2:1 to 3:1.

One suitable gas mixture for the first step is produced by mixing oxygen with forming gas, which is a mixture of 96% nitrogen and 4% hydrogen. For example, a 10% oxygen: 90% forming gas mixture includes 10% oxygen, 3.6% hydrogen, and 86.4% nitrogen. This gas mixture provides a 25% increase in strip rate at 150° C. as compared to a similar mixture without oxygen. At higher temperatures, greater increases in relative strip rates may be achieved. The gas mixture may be formed, for example, by flowing 5 standard liters/minute of forming gas and 0.5 standard liters/minute oxygen into the plasma reactor at a pressure of from about 2.5–3.5 torr. At lower reactor pressures, lower flow rates are used. For example at 1.5–2 torr pressure, a mixture of 3.5 standard liters/minute forming gas and 350 ml/minute oxygen is preferred.

The combination of oxygen and hydrogen appears to have a synergistic effect on the strip rate, with the strip rate of the combination being greater than is achieved with a comparative gas mixture containing carrier gas and only hydrogen or oxygen. For example, the strip rate with 4% hydrogen and 10% oxygen is significantly greater than for a gas mixture containing 14% oxygen and no hydrogen or 14% hydrogen and no oxygen.

In the second step, the oxygen-free gas mixture used to form the plasma may be forming gas alone, or other suitable mixture of carrier gas and source of atomic hydrogen, as discussed above, or other suitable reducing gas, although it is desirable that water not be used as the source of hydrogen atoms in this step due to the concurrent formation of oxygen atoms. The second, and any subsequent plasmas, are preferably substantially free of oxygen. By substantially free, it is meant that the gas mixture contains no more than a trace amount of oxygen. While two steps are preferred to practical conservation, more steps may be employed. Those steps where oxygen is not present in the gas mixture can reverse any low level of oxidation which may have occurred in the first, or preceding step.

The stripping of the photoresist layer substantially occurs in the first step. Some stripping may also occur in the second step, although generally at a slower rate, due to the absence of oxygen.

A convenient plasma stripping process employs two gas supplies, one of forming gas, the other of oxygen. For the first step, a mixture of the two supplies is prepared in a chamber and then introduced into the plasma reactor. In the second step, forming gas alone is fed to the reactor.

Preferred conditions for stripping are dependent in the gas used in forming the plasma and on the plasma reactor used in the stripping process. Optimization is within the purview of those skilled in the art. For example, in producing a plasma from oxygen and forming gas, typical conditions under which suitable plasma can be formed include a power of 500–2,000 watts, preferably about 1000 watts. In addition, preferred reactor pressures are on the order of about 0.5 to 4 torr, more preferably, about 2 torr, depending on the quantities of hydrogen and oxygen present. Suitable reactor temperatures are from about 250° C. to about 270° C.

While the invention has been described with respect to a titanium nitride layer, it should be appreciated that the two-step plasma stripping process could also be used when other oxidizable layers are exposed to a plasma during photoresist stripping.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A method for removing a photoresist layer from a substrate comprising the steps of:

a) providing a substrate having an oxidizable layer and a photoresist layer, which layers are located directly or indirectly on a surface of the substrate; and b) exposing the substrate to a plasma containing hydrogen and oxygen in an amount effective to substantially strip the photoresist layer.

2. The method of claim 1, further including after step b):

c) exposing the substrate to a plasma which is substantially free of oxygen, said plasma containing hydrogen in an amount effective to at least partially reverse any oxidation of the oxidizable layer which has occurred in step b).

3. The method of claim 1, wherein the oxidizable layer includes titanium nitride.

4. The method of claim 1, wherein the plasma containing hydrogen and oxygen has an oxygen concentration of from about 5 to 20% by weight.

5. The method of claim 4, wherein the oxygen concentration is less than about 15% by weight.

6. The method of claim 1, wherein the plasma containing hydrogen and oxygen has a ratio of oxygen concentration to hydrogen concentration of from about 1:1 to about 4:1.

7. The method of claim 6, wherein the ratio of oxygen concentration to hydrogen concentration is from about 2:1 to about 3:1.

8. The method of claim 1, wherein the plasma containing hydrogen and oxygen has an hydrogen concentration of from about 2 to 10% by weight.

9. The method of claim 8, wherein the plasma containing hydrogen and oxygen has an hydrogen concentration of less than about 4% by weight.

10. The method of claim 1, wherein the plasma containing hydrogen and oxygen is produced from a gas mixture containing a source of hydrogen selected from the group consisting of $H_2$, $NH_3$, $CH_4$, $H_2O$, and combinations thereof.

11. The method of claim 10, wherein the gas mixture further includes an inert gas.

12. The method of claim 11, wherein the inert gas includes nitrogen.

13. The method of claim 2, wherein the plasma containing hydrogen is produced from a gas mixture containing a source of hydrogen selected from the group consisting of $H_2$, $NH_3$, $CH_4$, and combinations thereof.

14. The method of claim 13, wherein the gas mixture for forming the plasma containing hydrogen further includes an inert gas.

15. The method of claim 14, wherein the inert gas includes nitrogen.

16. The method of claim 1, further including, after step b):

rinsing the substrate with a rework solvent.

17. A method for removing a photoresist layer from a substrate comprising the steps of:

a) providing a substrate having an oxidizable anti-reflective coating and a photoresist layer, the coating and the layer being located directly or indirectly on a surface of the substrate;

b) exposing the substrate to a plasma containing hydrogen and oxygen; and c) exposing the substrate to a plasma formed from a reducing gas to at least partially reverse oxidation of the oxidizable layer which has occurred in step b).

18. The method of claim 17, wherein the reducing gas is substantially free of oxygen.

19. The method of claim 17, wherein the reducing gas includes hydrogen.

20. The method of claim 17, wherein the plasma containing hydrogen and oxygen has an oxygen:hydrogen ratio of from 1:1 to 4:1.

* * * * *